United States Patent [19]

Wheeler et al.

[11] Patent Number: 5,640,473

[45] Date of Patent: Jun. 17, 1997

[54] METHOD AND APPARATUS FOR GENERATING AN OPTICAL BEAM FOR USE IN AN IMAGING SYSTEM

[75] Inventors: Joseph A. Wheeler, Vernon, Conn.; David R. Fournier, Groton, Mass.; Ronald J. Straayer, South Windsor, Conn.

[73] Assignee: Gerber Systems Corporation, South Windsor, Conn.

[21] Appl. No.: 677,343

[22] Filed: Jul. 2, 1996

[51] Int. Cl.$^6$ .................................................. G02B 6/26
[52] U.S. Cl. .................. 385/27; 372/24; 372/38; 385/140
[58] Field of Search .................. 372/24, 6, 31, 372/38; 385/901, 27, 88, 89, 90, 91, 92, 93, 94, 140

[56] References Cited

U.S. PATENT DOCUMENTS

| | | | |
|---|---|---|---|
| 4,637,679 | 1/1987 | Funato | 350/6.5 |
| 4,662,708 | 5/1987 | Bagdal | 350/6.9 |
| 4,684,228 | 8/1987 | Holthusen | 354/4 |
| 4,818,049 | 4/1989 | Assenheim et al. | 350/96.15 |
| 5,008,889 | 4/1991 | Wilson | 372/32 |
| 5,157,533 | 10/1992 | Hanamoto | 359/204 |
| 5,181,137 | 1/1993 | Koide . | |
| 5,225,924 | 7/1993 | Ogawa et al. . | |
| 5,309,274 | 5/1994 | Akanabe . | |
| 5,325,381 | 6/1994 | Paoli | 372/24 |

Primary Examiner—John Ngo
Attorney, Agent, or Firm—McCormick, Paulding & Huber

[57] ABSTRACT

An optical beam generator system for use in an imaging system that forms an image in a substrate comprises a beam generator, a mode filter and a state selector. The optical beam has a first power level above an exposure level that exposes the image in the substrate and a second power level below the exposure level which does not expose the substrate. The beam generator generates a near single mode coherent optical beam in response to received command signals corresponding to an "on" state and generates a multimode incoherent optical beam in response to received command signals corresponding to an "off" state. The filter is optically coupled to the beam generator and attenuates an optical component of the received optical beam which is not single mode to a magnitude below the exposure level. The state selector generates the "on" and "off" command signals corresponding to the "on" and "off" states such that the filter outputs the coherent optical beam with minimal attenuation during the "on" state and with maximum attenuation during the "off" state.

11 Claims, 6 Drawing Sheets

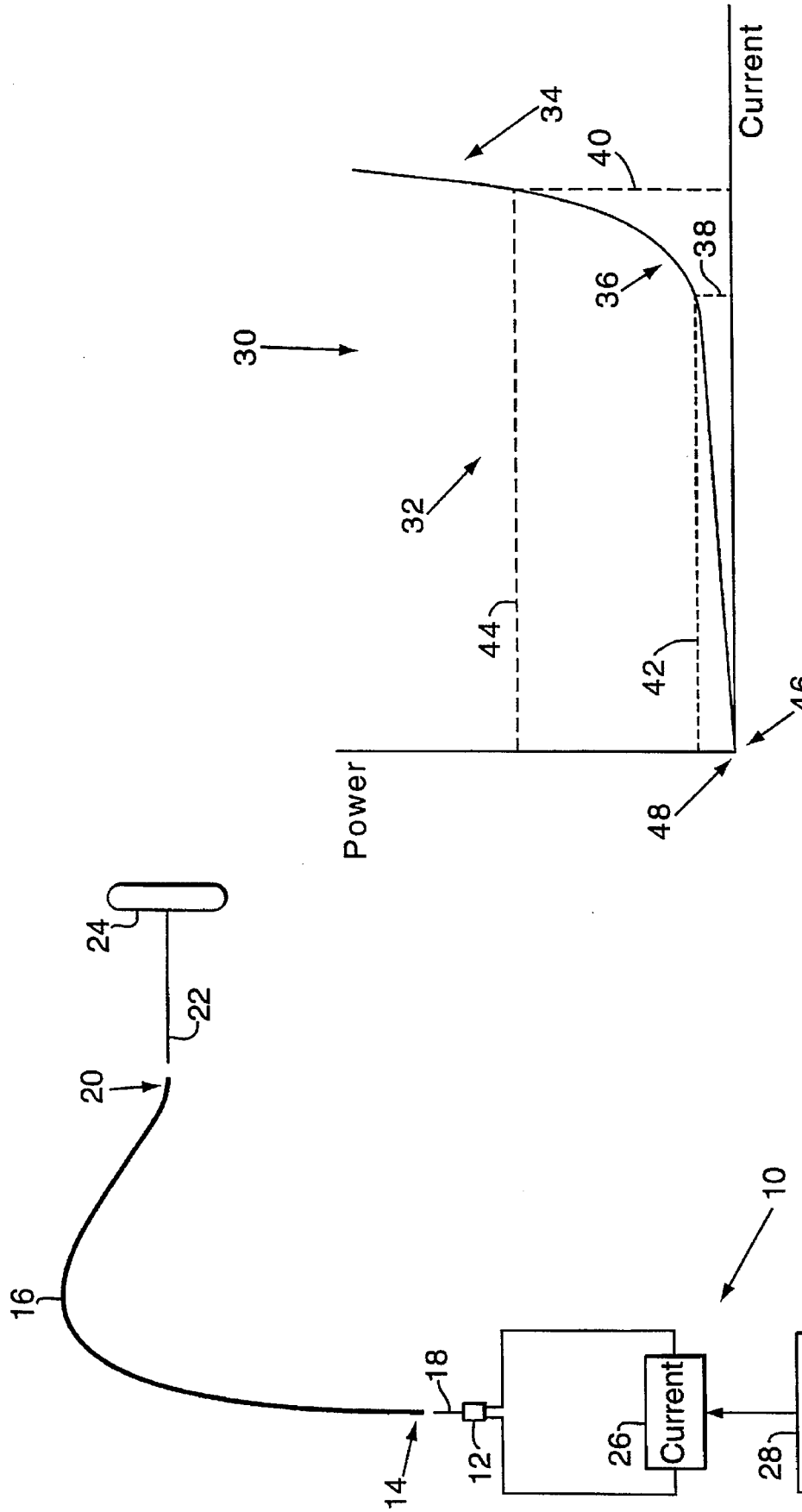

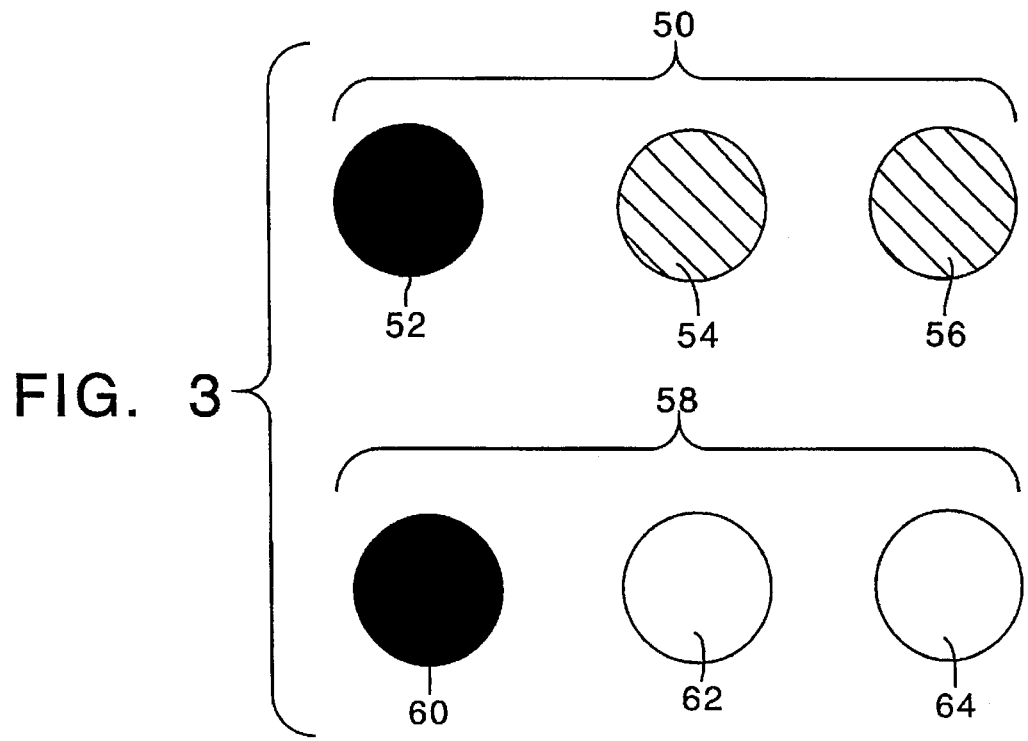
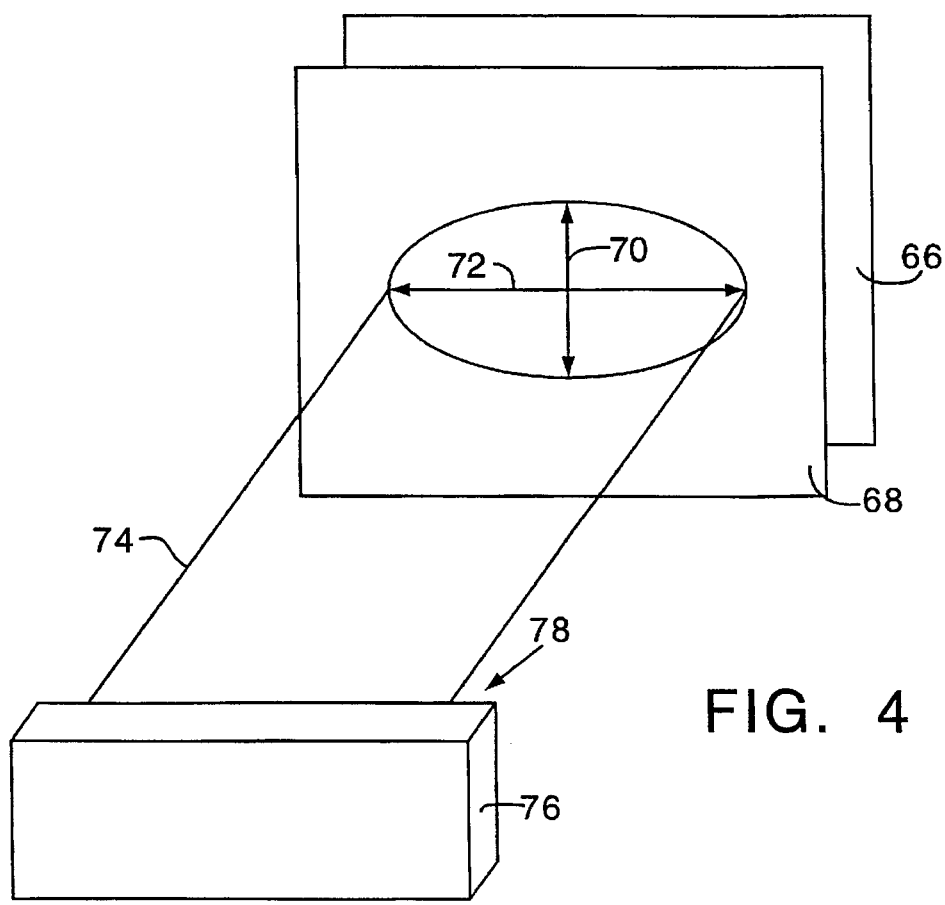

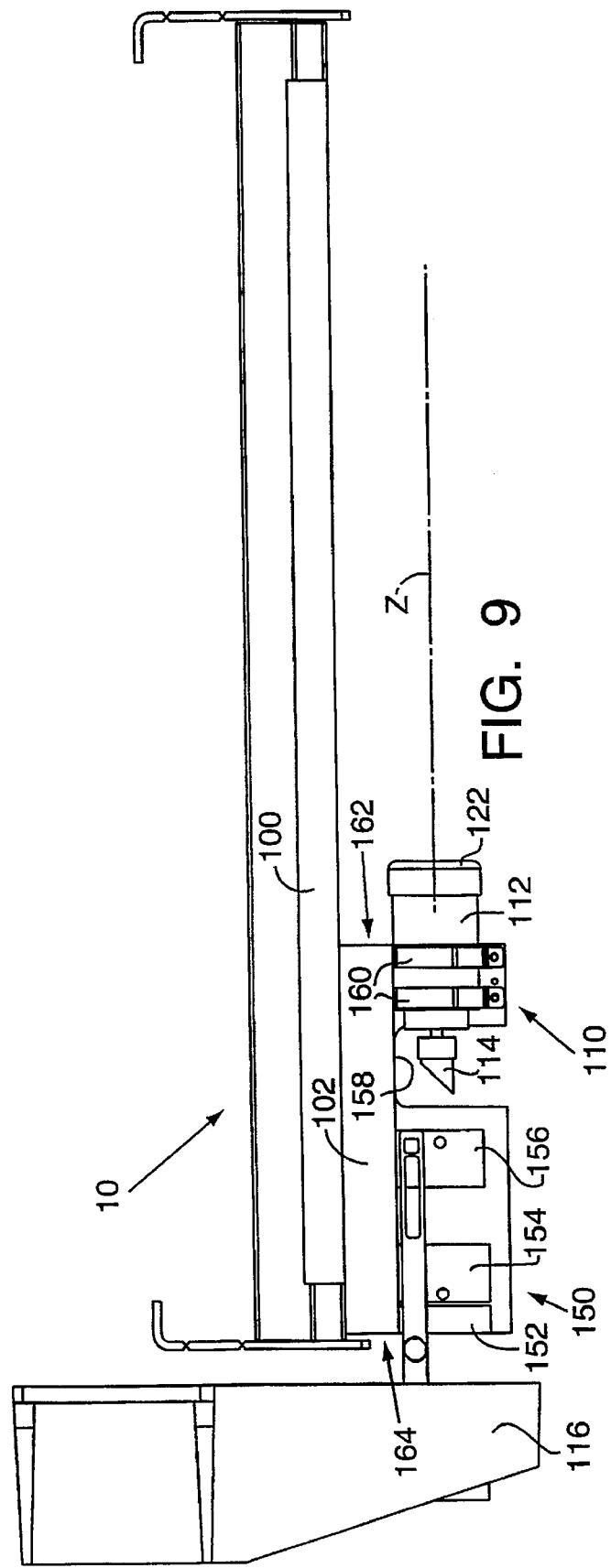

METHOD AND APPARATUS FOR GENERATING AN OPTICAL BEAM FOR USE IN AN IMAGING SYSTEM

FIELD OF THE INVENTION

The present invention relates to optical beam generating systems in general and, more particularly, to optical beam generating systems which use a laser diode to generate an imaging beam.

CROSS REFERENCE TO RELATED APPLICATIONS

Some of the matter contained herein is disclosed and claimed in the commonly owned U.S. patent application Ser. No. 08/674,763, entitled "Magnetically Preloaded Air Bearing Motion System For An Imaging Device"; U.S. patent application Ser. No. 08/764,439, entitled "Apparatus And Method For Positioning A Lens To Expand An Optical Beam Of An Imaging System" and U.S. patent application Ser. No. 08/674,766, entitled "A Method And Apparatus For Imaging At A Plurality Of Wavelengths" incorporated herein by reference.

BACKGROUND OF THE INVENTION

Imaging systems of both planar and internal drum design are known in the art. These devices are used in the graphics arts fields as well as in the fabrication of printed circuit boards. Planar imaging systems, such as are disclosed and claimed in U.S. Pat. No. 4,851,656 and incorporated herein by reference, are types of imaging systems which have a planar surface for receiving a substrate. An optical exposure head is located on a movable gantry apparatus and is rastered above the substrate during exposure. Internal drum devices, on the other hand, have a cylindrical drum surface portion to receive a substrate. An optical beam generator emits an optical beam onto a spinning mirror, and the mirror reflects the beam onto the substrate. As the mirror spins, the reflected beam advances across the substrate surface from a starting edge of the surface to an ending edge thereof, exposing a sequence of pixels which together form a scan line perpendicular to the axis of the drum. The spinning mirror is mounted on a carriage which moves in a direction perpendicular to the scan line. After the reflected beam advances to the ending edge, the carriage moves perpendicular to the scan line. When the reflected beam begins again at the starting edge of the surface, the beam advances across a new scan line. The reflected beam advances across the entire surface area of the drum in this manner.

A laser diode is a known device for generating optical beams and comprises a p-n semiconductor junction which generates coherent, substantially single-wavelength, highly directional electromagnetic radiation when drive current into the diode reaches a lasing threshold level. A description of laser diodes can be found in "Viable Laser Diodes" and "Semiconductor Laser Diodes", both of which are in the 1996 Photonics Design and Applications Handbook, incorporated herein by reference.

Laser diodes are commercially available in a variety of power output levels and optical radiation wavelengths. The output power of the laser diode optical beam depends on the electrical current provided to drive the laser diode low values of drive current, the output power is low. The laser diode thereby operates as a light emitting diode (LED) in a first operational mode. In the LED mode, the diode emits an incoherent optical beam in a broad emission "cone" extending from the edge of the diode. The LED beam is comprised of radiation of many different wavelengths and many optical modes. Beyond a value of drive current known as the lasing threshold, the laser diode operates in a second operational mode known as lasing mode. In the lasing mode, the diode emits a laser beam of a single narrow wavelength band and optical quality which approaches single longitudinal mode. As discussed hereinbelow, the laser beam has several characteristics rendering it ill-suited for use in an imaging system.

To use the laser diode in an imaging system, the system must present a modulated laser beam of controlled power to image a substrate. One method of accomplishing the same is to switch the diode on and off between controlled states. A rate at which the laser diode can switch between an "on" state, wherein the diode emits a laser beam, and an "off" state, wherein the diode does not emit a laser beam, determines an imaging rate. In the "off" state, drive current is typically zero, while in the "on" state drive current is typically a current level which is above the lasing threshold. Thus, a difference between beam power when in the "on" state and beam power when in the "off" state is exactly the beam power of the laser beam when in the "on" state. A ratio of power of the beam in the "on" state to the power of the beam in the "off" state defines a contrast ratio. As is known in the art, a high contrast ratio is preferred in order to create a sharp image on the substrate. In an imaging system where the diode emits no beam in the "off" state, the contrast ratio is infinite. A large contrast ratio is highly desirable because it permits a full range of exposure control to service the demands of different media, exposure rates, i.e. scan rates, and resolution.

Unfortunately, the time required to switch from the one current to the off current limits the imaging rate. Though narrowing the difference between the off current and the on current increases the imaging rate, it increases the beam power when in the "off" state and thereby lowers the contrast ratio. Another option for intermittently emitting a laser beam to image a substrate is to keep the diode in the lasing mode and vary the continuously emitted laser beam with a modulator which is external to the diode. Types of modulators include acousto-optic modulators known as Bragg cells as well as electro-optic modulators known as Pockels cells and Kerr cells. However, these external modulators are costly and must be precisely aligned with the laser beam. Aligning optical components and maintaining their alignment is a time consuming and error prone task.

To use a beam generator in an imaging system, the beam generator must emit a collimated laser beam which has a desired diameter, wavelength and power level and which is circularly symmetrical and diffraction limited. A laser beam which is circular symmetrical and diffraction limited forms an imaging spot upon the substrate which is well defined and has a maximal focus depth, and requires a minimal beam diameter. Unfortunately, a laser beam produced by a laser diode has an anamorphic divergence pattern, rather than a symmetrical divergence pattern, and also suffers from astigmatism. These deficiencies in the laser beam are departures from true single mode behavior. Conventional imaging systems employ precisely aligned and costly multi-element lenses and prisms to alter a laser beam so that it is circular symmetrical and diffraction limited. However, even these costly remedies do not improve the limitations in contrast ratio and imaging rate.

In addition, in conventional optical beam generators in which a laser diode generates the optical beam, the diode is located within a housing mounted to the imaging system. If the laser diode fails, the module which houses the diode must be removed from the imaging system, and the diode is removed from the housing and replaced. The housing is then remounted on the imaging system and precisely realigned with other components of the imaging system such as lenses and mirrors. It would be advantageous to provide an optical beam generator which does not require realignment after a failed laser diode is replaced.

It would be advantageous to provide an optical beam generator which emits a collimated optical beam having a desired diameter, wavelength and power level, and which optical beam is furthermore circularly symmetrical and diffraction limited.

It would be further advantageous to provide an optical beam generator with a high imaging rate and which emits an optical beam having a high contrast ratio. The present invention is directed towards such a system.

SUMMARY OF THE INVENTION

An object of the present invention is to provide an optical beam generator which emits a collimated optical beam having a desired diameter, wavelength and power level, and which optical beam is furthermore circularly symmetrical and diffraction limited.

Another object of the present invention is to provide an optical beam generator with a high imaging rate and which emits an optical beam having a high contrast ratio.

Another object of the present invention is to provide an optical beam generator which does not require realignment after a failed laser diode is replaced.

According to the present invention, an optical beam generator system for use in an imaging system that forms an image in a substrate, wherein the optical beam has a first power level above an exposure level that exposes the image in the substrate and a second power level below the exposure level which does not expose the substrate, comprises a beam generator, a mode filter and a state selector. The beam generator generates a coherent optical beam having a near single mode behavior in response to received command signals corresponding to an "on" state and generates a multimode incoherent optical beam in response to received command signals corresponding to an "off" state. The filter is optically coupled to the beam generator and attenuates multi-mode behavior. The state selector generates the "on" and "off" command signals corresponding to the "on" and "off" states such that the filter outputs the coherent optical beam with minimal attenuation during the "on" state and with maximum attenuation during the "off" state.

According to another aspect of the present invention, a method for generating an imaging beam for use in an imaging system that forms an image in a substrate, wherein the optical beam has a first power level above an exposure level that exposes the image in the substrate and a second power level below the exposure level which does not expose the substrate, comprises the steps of generating a coherent optical beam having a near single mode behavior in response to received command signals corresponding to an "on" state; generating a multimode incoherent optical beam in response to received command signals corresponding to an "off" state; attenuating an optical component of the received optical beam to a magnitude below the exposure level; and generating the "on" and "off" command signals corresponding to the "on" and "off" states such that the coherent optical beam is output with minimal attenuation during the "on" state and maximum attenuation during the "off" state.

BRIEF DESCRIPTION OF THE DRAWINGS

FIG. 1 is simplified schematic illustration of an apparatus for generating an optical beam provided in accordance with the present invention.

FIG. 2 is a chart which represents laser diode power output for different values of drive current.

FIG. 3 is a schematic illustration of exposed and unexposed spots on a substrate.

FIG. 4 is a schematic illustration of a laser beam generated by a laser diode.

FIG. 9 is a simplified illustration showing a zoom lens system of an imaging system.

DESCRIPTION OF PREFERRED EMBODIMENT

Figure 5:
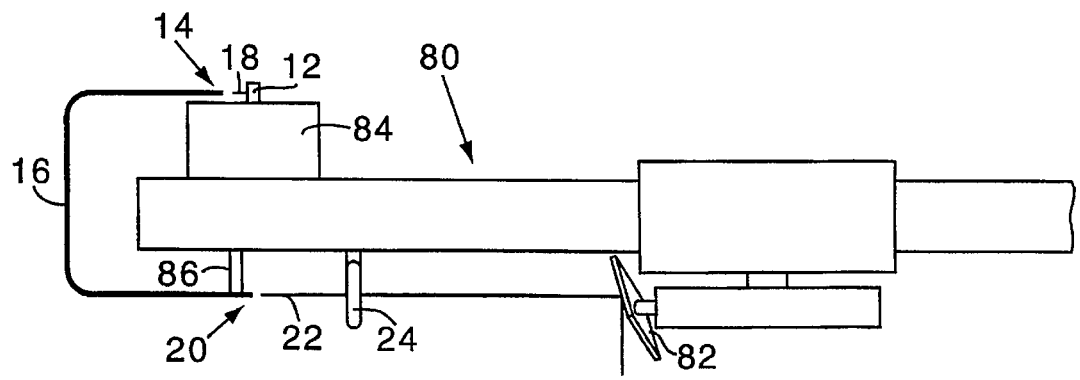
FIG. 5 is an illustration of the apparatus of FIG. 1 as used in an imaging system provided in accordance with the present invention.

As shown in FIG. 1, an optical beam generator 10 includes a 670 nanometer, 10 milliWatt edge-emitting index-guided laser diode 12. An optical beam generator provided in accordance with the present invention generates a high quality, directly modulated laser beam which is suitable for use in an imaging system.

FIG. 2 shows a chart 30 which represents laser diode power output for different values of drive current provided to the diode. The output power of the laser diode optical beam varies nonlinearly with the drive current. For low values of drive current, the diode operates in LED mode, indicated by reference numeral 32. In LED mode, the output power is low and increases slowly as drive current increases. Beyond the lasing threshold 36, the diode output power increases nonlinearly with increases in drive current. When the diode 12 is in the lasing mode, indicated by reference numeral 34, the diode 12 emits a single wavelength laser beam.

The imaging rate is defined by a rate at which the drive current into the diode varies between an on current while in the "on" state and an off current while in the "off" state. Though a high imaging rate, such as above 50 MHz, is preferable, high imaging rates require more power to rapidly switch the drive current into the laser diode. Conventionally, the current is varied between a value of current above the lasing threshold and zero current. The time required to change a drive current source from one current level to another is function of the magnitude of the difference between the two current levels. The greater the difference therebetween, the more time is needed to effect the change. Thus, imaging rates are determined in large part by the range over which the drive current must be switched.

For example, to switch from a high power level 44 to zero power 48, the drive current must vary between a current value 40 to a current value 46. The large difference between the current levels 40 and 46 restricts the imaging rate. Increasing the imaging rate by shortening the range in which the drive current varies is possible by varying the drive current between current value 40 above the lasing threshold and a small, but non-zero, value of current 38 which is below the lasing threshold. The small difference between the current values 40 and 38 allows the imaging rate to be very high. However, when the drive current is at the value 38, the diode is in the LED mode and emits an optical beam having a small but nonzero power level indicated by reference numeral 42. The difference in beam power between the "on" state and the "off" state, and therefore the contrast ratio, is lower than if the diode emits no beam at all in the "off" state. Thus, improving the imaging rate reduces the contrast ratio, and vice versa. To maintain a high contrast ratio, the power of the LED beam when the current is at the level 38 must be selectively attenuated.

Referring again to FIG. 1, the laser diode 12 is optically coupled to a first end 14 of a single mode optical fiber 16. The diode is preferably a Toshiba 9225 670 nanometer diode, and the fiber is preferably a single mode optical fiber fabricated by Point Source, Inc. which is three meters in length and has a numerical aperture of 0.07 NA. The laser diode 12 emits a beam 18 into the first end 14 of the fiber 16. Due to the single mode nature of the fiber 16, the fiber 16 transfers optical radiation having a wavelength of 670 nanometers from the first end 14 to a second end 20 substantially unaltered. That is, the fiber does not substantially reduce the intensity of optical radiation of a single mode laser. However, the fiber 16 does substantially reduce the intensity of optical radiation having multiple modes. In the preferred embodiment, the fiber 16 substantially reduces the intensity of optical radiation which is multimode, thereby defining a maximum attenuation of the fiber 16.

Thus, when the fiber 16 receives optical radiation at the first end 14, a filtered beam 22 emerges from the second end 20 of the fiber 16. The second end 20 thereby acts as a source of the filtered beam 22. The filtered beam 22 which emerges from the second end 20 is single mode. The diode 12 is in the LED mode when in the "off" state. Though the diode 12 emits a beam having many modes when in the "off" state, the single mode optical fiber 16 only transfers a component of the beam 18 having a prescribed mode. Thus, the filtered beam 22 which emerges from the: second end 20 is essentially single mode. The filtered beam 22 furthermore has a power which is substantially less than the power of the beam 18 which the first end 14 receives, since the fiber 16 only transmits one component of the beam 18.

However, the fiber 16 minimally attenuates the beam 18 when the diode 12 is in the "lasing" state, because the laser beam has a single mode matched to the fiber. Since the fiber 16 significantly reduces the power of the beam 18 when in the "off" state, but the fiber 16 does not significantly reduce the power of the beam 18 when in the "on" state, the contrast ratio is very high, typically 500:1. The high contrast ratio improves image quality and prevents "media fogging", a problem described hereinbelow.

The attenuation of the laser beam during the "on" state is due to natural attenuation properties of the fiber as well as attenuation effects which make the natural near single mode laser diode behavior truly single mode, i.e. making the non circular beam circular and removing the astigmatism. The minimum attenuation of the fiber is typically 5 dB, or 30% transmission. The maximum attenuation during the "off" state is not infinite, but instead limited to typically 12 dB, or 6% transmission.

An optical beam exposes a spot on imaging media when the power of the optical beam is at or above a prescribed exposure level. If the power of the beam is slightly above this exposure level, the media spot is slightly exposed. If the power of the beam greatly exceeds the exposure level, the media spot is strongly exposed. Clearly, if both on beam power and off beam power are above the exposure level, the media will be at least partially exposed even at spots which should be unexposed.

FIG. 3 depicts a first set of spots 50 upon a substrate which are "foggy", i.e. in the first set of spots 50, there is not a great difference between spots which are exposed (black) and spots which should not be exposed (white), but in fact are slightly exposed. Such foggy images result from a low contrast ratio imaging system. Spot 52 is an exposed spot while spots 54 and 56 are intended to be unexposed. Spots 52, 54 and 56 all are varying shades of gray. An image which is composed of such relatively undifferentiated spots appears foggy. On the other hand, a second set of spots 58 exhibits a greater difference between spots which are exposed and spots which are not exposed. A high contrast ratio system produces such differentiation among spots. A spot 60 is an exposed spot and spots 62 and 64 are unexposed. The unexposed spots 62 and 64 are in fact devoid of any exposure, and thus are sharply differentiated from the exposed spot 60.

The first set of spots 50 are representative of images produced by conventional optical beam generating systems which vary drive current between a level of current above the lasing threshold and a non-zero level of current below the lasing threshold. The contrast ratio is lower than desirable, and thus the LED beam which results when the diode is in the off state partially exposes the media. The second set of spots 58 are representative of images produced by an optical beam generating system provided in accordance with the present invention.

FIG. 4 illustrates several undesirable qualities of a laser beam generated by a laser diode. A laser beam 74 emitted by laser diode 76 has a divergence pattern which is highly anamorphic, i.e. the laser beam 74 has a divergence in a first axis 70 perpendicular to the diode junction 78 which is much higher than a divergence in a second axis 72 which is parallel to the axis of the junction 78. The laser beam 74 also suffers from astigmatism, wherein the laser beam 74 focuses in a first plane 66 in the first axis 70 of the beam 74 and focuses in a second plane 68 in the second axis 72 of the beam 74. Typically, the two planes 66 and 68 are separated by six to ten microns.

The present invention eliminates the undesirable qualities which make the diode laser beam unsuitable for use in an imaging system. As is known in the art, single mode optical radiation is inherently circularly symmetrical and diffraction limited, rather than having an anamorphic divergence pattern, and is also free from astigmatism. Referring again to FIG. 1, since the numerical aperture of the fiber 16 is very small, the filtered beam 22 which emerges can easily be collimated, for example by a collimating lens 24 located downstream of the second end 20. To cure astigmatism and anamorphic divergence in the laser beam, there is no need for a collection of bulky and complex optical components and the alignment problems attendant therewith.

In addition to remedying several undesirable optical qualities in the laser beam, the present invention provides mechanical advantages over conventional optical beam generating systems. As explained hereinabove, the second end 20 of the fiber 16 acts as a source of the filtered beam 22, and the second end is therefore treated like a conventional beam generator. FIG. 5 shows the second end 20 affixed to an imaging system 80 by a fastening means 86 such as a bracket. The second end 20 is aligned with imaging system components, such as a mirror 82 and the collimating lens 24, just as if the second end 20 were a conventional beam generator, like a laser diode. Since the fiber 16 is lengthy and flexible, the end 20 from which the filtered beam 22 emerges need not be adjacent to the laser diode 12 itself.

The end 14 of the fiber 16 which receives the laser beam 18 from the diode 12 is located away from the end 20 from which the filtered beam 22 emerges. The end 14 is typically mounted on an electronic module 84 containing electronic components (not shown) which control the diode 12, such as a current source 26 and controller 28. Thus, only the end 20 which must be precisely aligned with the rest of the imaging system 80. Thus, if the laser diode 12 fails, the fiber 16 can be uncoupled from the diode 12 without disrupting the alignment of the collimating lens 24 and the mirror 82. The diode 12 can then be replaced, and the fiber 16 recoupled thereto. Since the end 20 from which the filtered beam 22 emerges is also located away from the electronic components of the module 84, the end 20 is likewise located away from any noise generated thereby.

Figure 6:
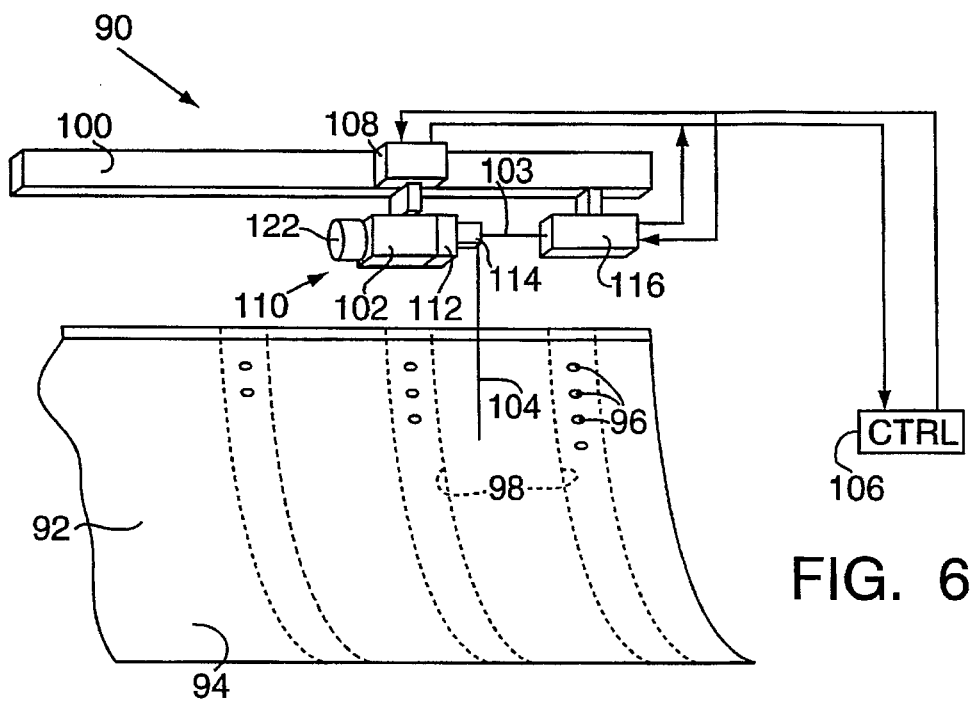
FIG. 6 is a simplified schematic illustration of a portion of an internal drum in an imaging system provided in accordance with the present invention.
Figure 7:
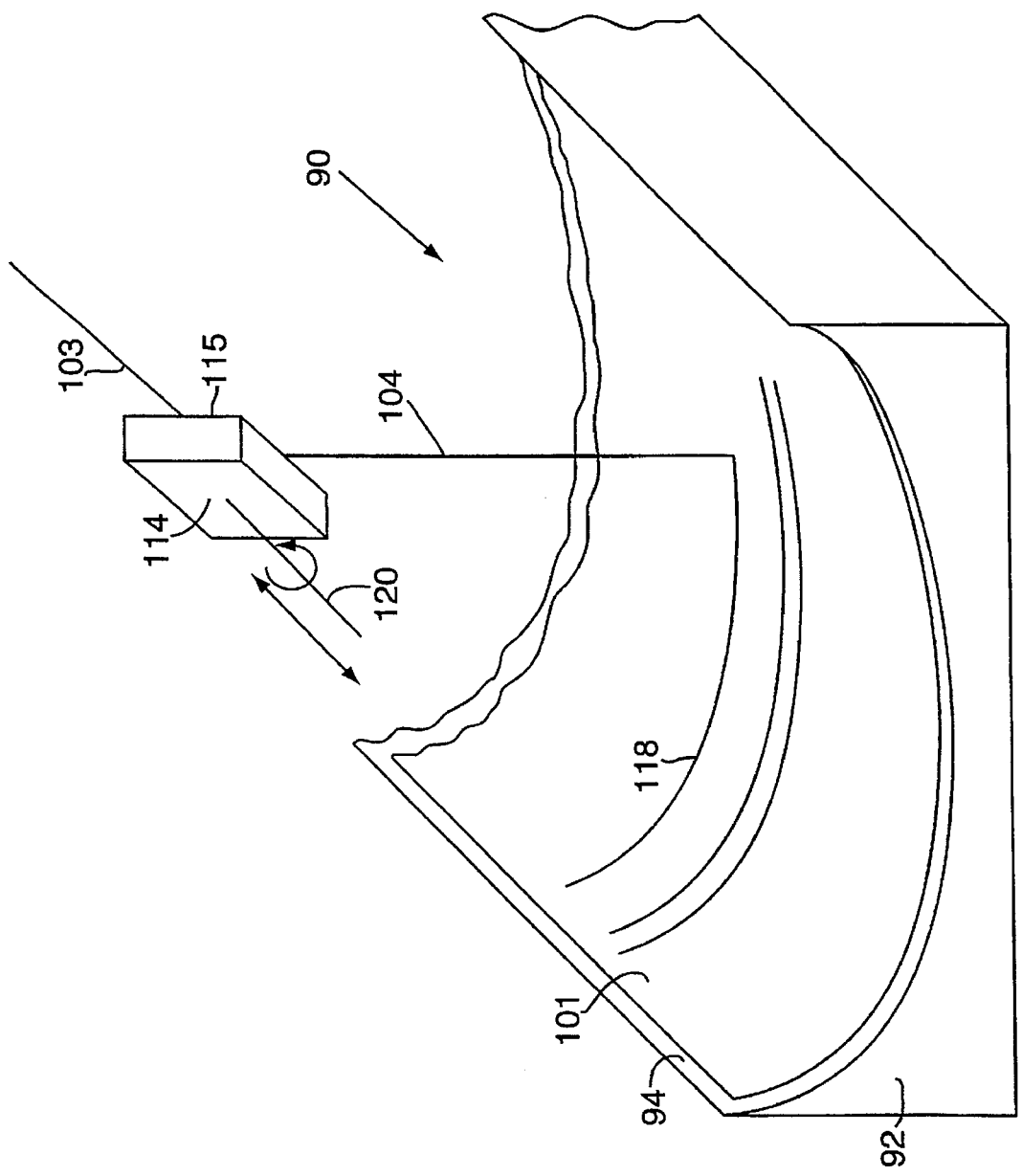
FIG. 7 is a simplified illustration showing the system of FIG. 6 scanning an optical beam across a portion of a substrate surface.

Referring now to FIGS. 6 and 7, a portion of an internal drum imaging system 90 which utilizes a laser diode beam generator as described hereinabove has an internal drum 92 with a surface 94 that comprises part of a cylinder. The internal drum is carefully fabricated and must maintain its preferred geometry (i.e., cylindricity) of the surface 94 with great accuracy. To that end the internal drum is a substantial structure preferably of cast aluminum with a series of reinforcing ribs (not shown) spaced along an outside perimeter.

As shown in FIG. 7, the surface 94 is adapted to receive a substrate 101. The substrate 101 may be a sheet of aluminum or polymer, such as polyester, having a photosensitive emulsion coated on one surface thereof or a sheet of photosensitive film. The surface 94 further includes a plurality of holes 96 (FIG. 6) in fluid communication with a plurality of internal channels 98 through which a conventional vacuum source and associated manifold system (not shown) generates a vacuum. The vacuum holds the substrate in place during an exposure process. Alternative methods can be equivalently used to hold the substrate in place, including electrostatic and mechanical retention techniques.

The imaging system 90 also includes a rail 100 that has a carriage 102 for scanning a reflected optical beam 104 about the substrate surface in response to beam command signals received from a controller 106. The carriage includes a linear encoder 108 for generating signals indicative of the position of the carriage as it moves along the rail, a fast scan apparatus 110 preferably comprised of a linear motor 112 and mirror 114 for receiving an emitted optical beam 103 at a mirror surface 115 from an beam generating module 116, such as a laser diode and optical fiber, and for exposing a series of scan lines 118 (FIG. 7) on the substrate by rotating the mirror about a spin axis 120, typically at 24,000 revolutions per minute. A rotary encoder 122 is included for generating signals indicative of the angular position of the mirror surface during a scan. The mirror surface is preferably fabricated to have an off-axis parabolic curvature.

The linear motor 112, similar to one manufactured by Trilogy Systems Corp., provides the means to move the carriage 102 along the length of the rail 100. The linear motor 112 is preferably a d.c. brushless motor comprising a coil assembly and a magnetic track assembly. The coil assembly includes preferably a plurality of motor windings or phases (not shown) that are switched or commutated by sinusoidal commutation. Sinusoidal commutation provides near perfect smoothness, meaning the carriage 102 travels at a controlled velocity with little or no bounce or discontinuity in the movement of the carriage. Graphic arts imaging requires a high degree of precision when scanning the imaging beam onto the media and therefore, travel of the carriage 102 along the rail 100 at a constant velocity is critical. Discontinuity in the movement or variation in velocity of the carriage results in the problem of "banding" or longitudinal lines formed in the substrate 101.

Figure 8:
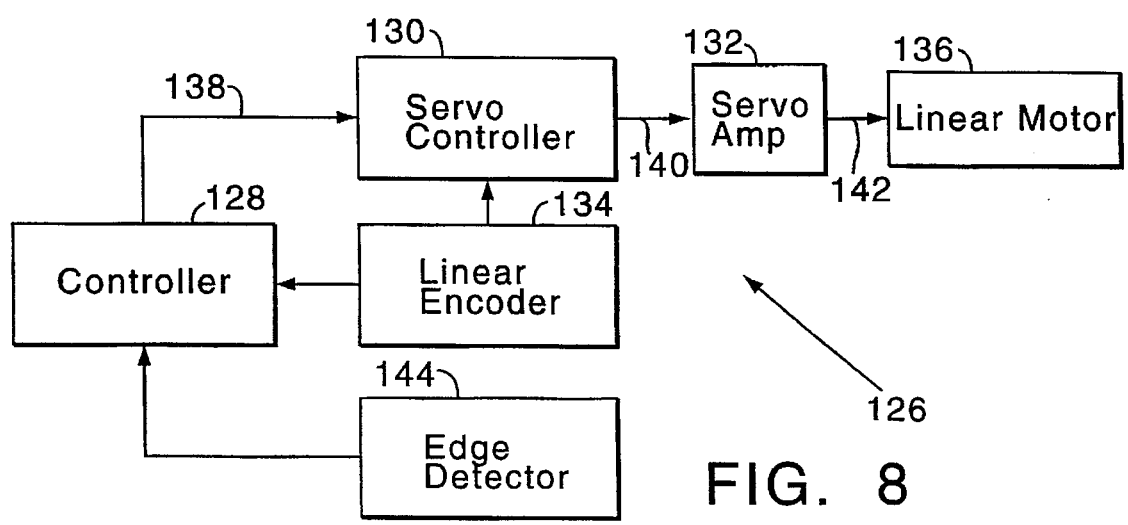
FIG. 8 is a schematic illustration of motor control system of the imaging system of FIG. 6.

Schematically shown in FIG. 8, a motor control system 126 includes a controller 128, a servo controller 130, a servo amplifier 132 and a linear encoder 134. The motor control system 126 provides drive signals to the windings of the linear motor 136. The controller 128 provides input signals over a serial RS232 port 138 to the servo controller 130, such as one manufactured by Delta Tau. The servo controller 130 provides a signal through conductor 140 to the servo amplifier 132 which then provides sinusoidal drive signals to the coil assembly of the linear motor 136 through conductor 142. The linear encoder 134 provides a signal indicative of the position of the carriage 102 along the rail 100 to the servo controller 130 to close the position loop of the servo and to the controller 128. The controller 128 stores the position of the carriage 102 in memory and monitors the position of the carriage 102 as it travels along the rail 100. The controller also initiates other functions that are dependent upon the position of the carriage on the rail such as starting and stopping the motor, controls velocity of the motor, provides signal to begin and end the scanning onto the substrate.

The linear encoder 134 includes a scale and an encoder head. The scale is mounted longitudinally to the lower edge of the rail and the encoder head is mounted to the edge of the horizontal plate of the rail. In the preferred embodiment, the resolution of the encoder is 0.25 micron.

In the operation of the motor control system 126, the controller 128 provides a signal to the servo controller 130 to energize the linear motor 136 and move the carriage to a predetermined initial position at one end of the rail 100. A position register of the controller 128 is then initialized to zero counts. After the substrate 101 is secured within the drum 92, the carriage 102 is commanded by the controller to move forward until the edge of the media is detected by an edge detector 144. The controller 128 stores in memory the number of counts between the initial position and the edge of the substrate 101 and commands the linear motor 136 to move the carriage 102 to approximately one inch back from the edge of the media. This predetermined distance permits the carriage 102 to accelerate to a constant velocity before reaching the edge of the substrate. When the scanning process begins, the controller 128 energizes the linear motor 136 to move the carriage. When the controller determines the carriage 102 has reached the edge of the media, the controller provides an initiating signal to begin scanning the image on the media. After the carriage 102 has traveled the commanded distance along the rail 100, the controller 128 stops the carriage and reads its position. The controller then commands the carriage to slew or scram the carriage back to the zero position at a predetermined velocity.

Figure 10:
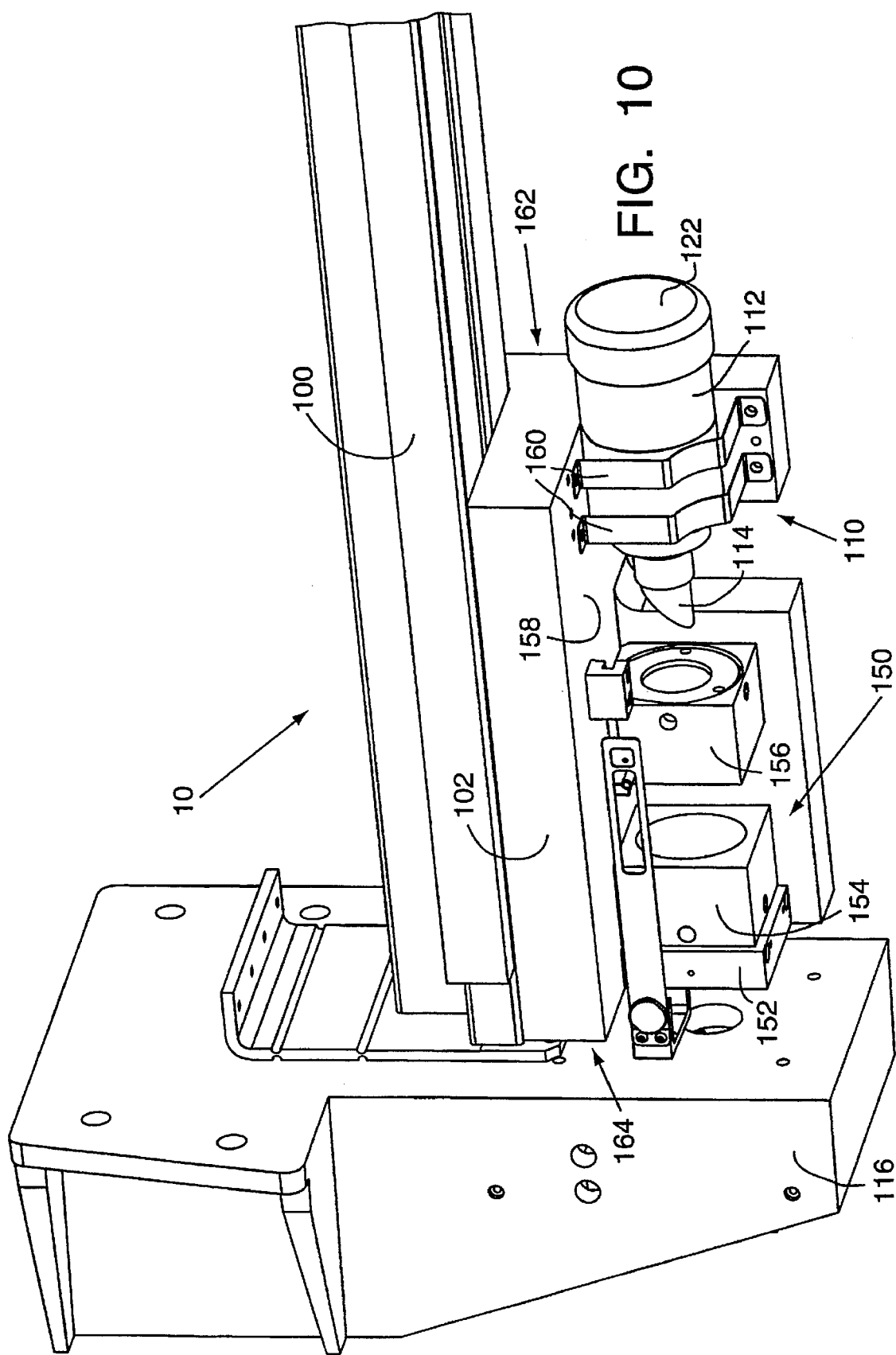
FIG. 10 is a more detailed illustration of the zoom lens system of FIG. 9.

Referring to FIGS. 9 and 10, in the preferred embodiment the imaging system 10 further includes a zoom lens system 150. The zoom lens system 150, described in greater detail hereinafter, includes a plurality of lens 152, 154, 156 secured to the carriage 102 for expanding or increasing the diameter of the emitted optical beam 103 from the light source. Preferably, the reflectance of the lenses 152, 154, 156 to beams of a desired imaging wavelength is less than 0.5%.

The fast scan apparatus 110 and zoom lens system 150 are secured to the lower orthogonal surface 158 of the carriage 102. The fast scan apparatus 110 is mounted to the carriage 102 by a pair of straps 160 at the forward end 162 of the carriage such that the mirror 114 is coaxial with a central axis z of the internal drum 92.

The zoom lens system 150 is mounted at the rearward end 164 of the carriage 102 and includes three coaxially spaced lenses 152, 154, 156 for expanding the diameter or magnification of the emitted beam 103 generated by the module 116. The zoom lens system 150 minimizes the effects of optical turbulence which adversely affects the image quality. In the internal drum, the emitted beam is exposed to air turbulence as it travels down the central axis z of the drum 92 to the mirror 114 on the carriage 102. It is known that the greater the diameter of the axial feed beam, the greater the effects of air turbulence. For this reason, the present invention sends a smaller and fixed size beam down the axis z of the internal drum 92. The typical diameter of the beam for a system having no zoom lens system is approximately 16.4 millimeters (mm) while the diameter of the beam is approximately 4 mm for a system having a zoom lens system on the carriage 102.

In the preferred embodiment of the zoom lens system 150, the characteristics of the lens 152, 154, 156 provide afocal expansion of the diameter of the feed beam. "Afocal" means that the emitted beam and output beam of the lens system 150 are both parallel to the axis of the lens. One skilled in the art, however, would recognize that any type of multi-configuration lens is possible without departing from the invention. The first or rearward most lens 152 is fixed securely to the carriage. The second and third lenses 154, 156 respectively are secured to the carriage by magnetic couplings. Two independently controlled air bearing (not shown) provide the means for adjustably positioning the lenses 154, 156 to vary the diameter and focus of the axial feed beam exiting the zoom lens system 150.

Although the invention has been shown and described with respect to a preferred embodiment thereof, it would be understood by those skilled in the art that other various changes, omissions and additions thereto may be made without departing from the spirit and scope of the present invention.

What is claimed is:

1. An optical beam generator system for use in an imaging system that forms an image in a substrate, the optical beam having a first power level an exposure level that exposes the image in the substrate and a second power level below the exposure level which does not expose the substrate, the optical beam generator system comprising:

a beam generator means for generating a coherent optical beam having a preferred mode in response to received command signals corresponding to an "on" state and for generating an incoherent optical beam in response to received command signals corresponding to an "off" state;

state selection means for generating said "on" and "off" command signals corresponding to said "on" and "off" states; and a mode filter means optically coupled to said beam generator means, said mode filter means for attenuating the optical components of the received optical beam not of said preferred mode to a magnitude below said exposure level, wherein during said "on" state said mode filter means performs a minimal attenuation of said coherent optical beam to the first power level, and wherein during said "off" state said mode filter means performs a maximum attenuation of said coherent optical beam to the second power level.

2. The optical beam generator system of claim 1, wherein said mode filter means is a single mode optical fiber.

3. The optical beam generator system of claim 2, wherein said be generator means further comprises a laser diode which receives drive current from a current source.

4. The optical beam generator system of claim 3, wherein said laser diode operates as a light emitting diode (LED) when said drive current has a value which does not exceed a lasing threshold level.

5. The optical beam generator system of claim 4, wherein said state selection means comprises a controller for generating said command signals to control said level of said drive current.

6. The optical beam generator system of claim 1, wherein said state selection means selects between said "on" state and said "off" state in accordance with received image signals.

7. A method for generating an imaging beam for use in an imaging system that forms an image in a substrate, the optical beam having a first power level above an exposure level that exposes the image in the substrate and a second power level below the exposure level which does not expose the substrate, the method comprising the steps of:

generating a coherent optical beam having a near single mode and having said first power level in response to received command signals corresponding to an "on" state generating an incoherent optical beam in response to received command signals corresponding to an "off" state;

generating said "on" and "off" command signals corresponding to said "on" and "off" states; and attenuating an optical component of the received optical beam not of said near single mode to said second power level.

8. The method of claim 7, wherein the step of generating said coherent optical beam further comprises the steps of presenting drive current from a current source to a laser diode, which drive current has a level which exceeds a lasing threshold level.

9. The method of claim 8, wherein the step of generating said incoherent optical beam further comprises the steps of presenting drive current from said current source to said laser diode, which drive current has a level which does not exceed said lasing threshold level.

10. The method of claim 7, wherein said step of attenuating said second optical beam comprises attenuating said second optical beam by approximately 12 dB.

11. The method of claim 7, wherein said step of selecting further comprises the steps of selecting between said "on" state and said "off" state in accordance with a received image signals.

* * * * *

UNITED STATES PATENT AND TRADEMARK OFFICE
CERTIFICATE OF CORRECTION

PATENT NO. : 5,640,473
DATED : June 17, 1997
INVENTOR(S) : Joseph A. Wheeler, David R. Fournier and Ronald J. Straayer It is certified that error appears in the above-indentified patent and that said Letters Patent is hereby corrected as shown below:

Claim 3:

Column 10, line 11, please delete "be" and substitute --beam--.

Signed and Sealed this

Twenty-eighth Day of October, 1997

Attest:

BRUCE LEHMAN

Attesting Officer

Commissioner of Patents and Trademarks